United States Patent
Zhang et al.

(10) Patent No.: US 10,020,822 B2
(45) Date of Patent: Jul. 10, 2018

(54) ERROR TOLERANT MEMORY SYSTEM

(71) Applicant: Rensselaer Polytechnic Institute, Troy, NY (US)

(72) Inventors: Tong Zhang, Watervliet, NY (US); Hao Wang, Hefei (CN)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 15/323,598

(22) PCT Filed: Jul. 20, 2015

(86) PCT No.: PCT/US2015/041115
§ 371 (c)(1),
(2) Date: Jan. 3, 2017

(87) PCT Pub. No.: WO2016/014399
PCT Pub. Date: Jan. 28, 2016

(65) Prior Publication Data
US 2017/0192691 A1    Jul. 6, 2017

Related U.S. Application Data
(60) Provisional application No. 62/026,727, filed on Jul. 21, 2014.

(51) Int. Cl.
*H03M 13/15* (2006.01)
*G06F 3/06* (2006.01)
(Continued)

(52) U.S. Cl.
CPC .......... *H03M 13/154* (2013.01); *G06F 3/064* (2013.01); *G06F 3/0611* (2013.01);
(Continued)

(58) Field of Classification Search
CPC ... H03M 13/154; G06F 3/0619; G06F 3/0611
See application file for complete search history.

(56) References Cited

U.S. PATENT DOCUMENTS 4,617,660 A * 10/1986 Sakamoto ........... G06F 11/1024
714/52
4,768,193 A *  8/1988 Takemae ............ G06F 11/1008
714/711
(Continued)

FOREIGN PATENT DOCUMENTS

| CN | 1983892 A | 6/2007 |
|---|---|---|
| CN | 102929743 A | 2/2013 |
| WO | 2016014399 A1 | 1/2016 |

OTHER PUBLICATIONS

International Search Report and Written Opinion for PCT/US2015/041115 dated Oct. 15, 2015.
(Continued)

*Primary Examiner* — Joseph D Torres
(74) *Attorney, Agent, or Firm* — Hoffman Warnick LLC (57) ABSTRACT

A system and method of providing error tolerant memory access operations on a memory device. A method is disclosed including: providing location information of weak memory cells, wherein the location information includes addresses grouped into tiered sets, wherein each tiered set includes addresses having a number of weak memory cells; receiving a target address for a memory read operation; reading data from a virtual repair memory if the target address belongs to a first tiered set of addresses having a number of weak memory cells exceeding a threshold; and if the target address does not belong the first tiered set of addresses, reading data from the memory device and alternatively performing (a) an error correction and error detec-
(Continued)

tion (ECED) operation and (b) a target address look up operation, at different settings, until an error free result is obtained.

7 Claims, 6 Drawing Sheets

(51) Int. Cl.
  *G06F 11/10* (2006.01)
  *H03M 13/00* (2006.01)
(52) U.S. Cl.
  CPC .......... *G06F 3/0619* (2013.01); *G06F 3/0659* (2013.01); *G06F 3/0673* (2013.01); *G06F 11/1076* (2013.01); *H03M 13/1575* (2013.01); *H03M 13/6502* (2013.01)

(56) References Cited

U.S. PATENT DOCUMENTS

| | | | |
|---|---|---|---|
| 5,383,193 A * | 1/1995 | Pathak | G11C 29/44 365/201 |
| 6,098,882 A | 8/2000 | Antognini et al. | |
| 6,868,022 B2 | 3/2005 | Scheuerlein et al. | |
| 7,313,749 B2 | 12/2007 | Nerl et al. | |
| 7,322,002 B2 | 1/2008 | Keays et al. | |
| 8,949,684 B1 | 2/2015 | Shalvi et al. | |
| 9,037,949 B1 * | 5/2015 | Vogelsang | G06F 11/1048 714/724 |
| 9,087,612 B2 * | 7/2015 | Franceschini | G06F 11/10 |
| 2002/0080654 A1 | 6/2002 | Shiga et al. | |
| 2006/0136645 A1 | 6/2006 | Merkin | |
| 2008/0010435 A1 * | 1/2008 | Smith | G06F 11/1076 712/10 |
| 2008/0126893 A1 * | 5/2008 | Harrand | G11C 7/04 714/719 |
| 2010/0271891 A1 * | 10/2010 | Dell | G11C 5/06 365/200 |
| 2010/0287447 A1 | 11/2010 | Eun et al. | |
| 2012/0240014 A1 | 9/2012 | Georgakos et al. | |
| 2013/0111295 A1 | 5/2013 | Li et al. | |
| 2013/0132779 A1 | 5/2013 | Smith et al. | |
| 2013/0173970 A1 | 7/2013 | Kleveland et al. | |
| 2013/0282973 A1 * | 10/2013 | Kim | G11C 11/40622 711/106 |
| 2014/0085999 A1 * | 3/2014 | Kang | G11C 29/023 365/222 |
| 2014/0098589 A1 | 4/2014 | Wang | |
| 2014/0164820 A1 * | 6/2014 | Franceschini | G11C 11/406 714/6.11 |
| 2014/0164874 A1 * | 6/2014 | Franceschini | G06F 11/10 714/764 |
| 2014/0241093 A1 * | 8/2014 | Lee | G11C 11/40611 365/222 |
| 2015/0046666 A1 * | 2/2015 | Lee | G06F 12/02 711/159 |

OTHER PUBLICATIONS

Nair et al., "ArchShield: Architectural Framework for Assisting DRAM Scaling by Tolerating High Error Rates" School of Electrical and Computer Engineering Georgia Institute of Technology, 12 pages, Copyright 2013.

Schechter et al., "Use ECP, not ECC, for Hard Failures in Resistive Memories" Microsoft Research, Redmond, WA, Georgia Institute of Technology, Atlanta, GA, 12 pages, Copyright 2010.

Yoon et al., "Virtualized and Flexible ECC for Main Memory" Electrical and Computer Engineering Department, The University of Texas at Austin, 12 pages, Copyright 2010.

Ankolekar et al, "Multibit Error-Correction Methods for Latency-Constrained Flash Memory Systems" IEEE Transactions on Device and Materials Reliability, vol. 10, Issue 1, 2010, pp. 33-39.

Li et al., "Design of a High Relieable L1 Data Cache with Redundunt Cache" IEEE 8th International Conference on ASIC, Biblioteka Nauki-Yadda, 2009, 5 pages.

* cited by examiner

ERROR TOLERANT MEMORY SYSTEM

This invention was made with government support under ECCS1201877 awarded by the National Science Foundation (NSF). The government has certain rights in the invention.

TECHNICAL FIELD

The subject matter of this invention relates to an error tolerant memory system that can mitigate errors in memory devices known to have weak memory cells.

BACKGROUND

With global market of over $35 B, DRAM (dynamic random access memory) is the primary memory technology being used to implement main memory in virtually all computing systems, from embedded and mobile devices to desktops and servers. Current DRAM chips can ensure error-free data storage (except for radiation-induced soft errors), which largely simplifies the overall computing system design. Each DRAM cell contains one transistor and one capacitor, and the memory cell capacitor must have sufficiently large capacitance in order to ensure error-free data storage. Unfortunately, it becomes increasingly challenging to maintain the sufficiently large capacitance (hence error-free data storage) as the industry strives to sustain the 30-year DRAM bit cost reduction by scaling down the DRAM technology into the sub-25 nm regime.

This challenge has led to a tremendous amount of research efforts over the past decade on developing new memory technologies, e.g., STT-RAM (spin-transfer torque RAM), PCRAM (phase-change RAM), and ReRAM (resistive RAM). It has become clear that STT-RAM has the true potential to complement or even replace DRAM as the main memory in computing systems.

Nevertheless, STT-RAM cannot achieve comparable bit cost as DRAM, at least in the foreseeable future, and the scalability of STT-RAM technology faces similar data storage reliability challenges as well. In summary, technology scaling of DRAM and its potential competitor STT-RAM face formidable challenges, which are seriously threatening the future growth of the entire semiconductor and computing industry. Accordingly, a need exists that will allow for continued technology scaling, and hence memory bit cost reduction, using available technology.

SUMMARY

This solution provides strong memory error tolerance for memory devices having weak memory cells, thus addressing difficulties of conventional memory scaling under the error-free data storage constraints. The described approach can be implemented with minimal overhead in terms of storage redundancy, memory access latency and energy consumption. By effectively relaxing the error-free data storage constraint, this approach can economically enables memory technology scaling towards 20 nm and below.

The present solution effectively utilizes dynamically configurable error correction, erasure correction, and error detection, which ensures the strongest memory error tolerance under given storage redundancy; and implements a hierarchical data processing procedure to minimize memory read latency and energy consumption overhead.

Advantages over current practice include the fact that this approach: (1) incurs much less storage redundancy overhead compared with the state of the art, especially under a high probability of weak memory cells; (2) does not incur any memory write latency penalty; (3) has a memory read latency penalty that is very small and automatically adapts to the varying runtime environment; and (4) does not require any changes to the memory chip circuit/interface design.

In a first aspect, the invention provides a method for handling error tolerant memory access operations on a memory device, comprising: providing location information of weak memory cells, wherein the location information includes addresses grouped into tiered sets, wherein each tiered set includes addresses having a predetermined number of weak memory cells; receiving a target address for a memory read operation; reading data from a virtual repair memory if the target address belongs to a first tiered set of addresses having a predetermined number of weak memory cells exceeding a threshold; and if the target address does not belong the first tiered set of addresses, reading data from the memory device and alternatively performing (a) an error correction and error detection (ECED) operation and (b) a target address look up operation, at different settings, until an error free result is obtained.

In a second aspect, the invention provides a method for handling memory access operations on a memory device, comprising: providing location information of weak memory cells, wherein the location information includes addresses hierarchically tiered into sets, wherein each set includes addresses having a predetermined number of weak memory cells; receiving a target address for a memory read operation; reading data from a virtual repair memory if the target address belongs to a first set of addresses having a predetermined number of weak memory cells exceeding a threshold; if the target address does not belong to the first set, performing an error correction and error detection operation at an initial setting without location information; if the error correction and error detection operation at the initial setting fails: (a) determine if the target address belongs to a subsequent tier of addresses and if so, use associated location information to perform error and erasure correction; (b) if the address does not belong to the subsequent tier of addresses, perform the error correction and error detection operation with an increased error correction setting and a decreased error detection setting; and (c) if the error correction and error detection operation fails, repeat (a)-(c).

In a third aspect, the invention provides a system for handling memory access operations on a memory device, comprising: a weak cell manager for storing location information of weak memory cells, wherein the location information includes addresses grouped into tiered sets based on a number of weak memory cells; a virtual repair module that reads data from a virtual repair memory if a target address being read belongs to a first set of addresses having a number of weak memory cells exceeding a threshold; an address check module that determines if the target address belongs to a selected set of addresses; and a coding module that performs error and erasure correction when the address check module determines that the target address belongs to the selected set of addresses, and performs error correction and error detection when the address check module determines that the target address does not belong to the selected set of addresses.

In a fourth aspect, the invention provides a system for providing error tolerant memory processing, comprising: a memory controller for writing data to and reading data from a memory device, wherein the memory controller includes a system for utilizing weak memory cell location information associated with the memory device to dynamically correct data access operations involving weak memory cells; a retrieval system for obtaining weak memory cell location information from a remote storage, wherein the retrieval system utilizes a unique identifier associated with the memory device to retrieve the weak memory cell location information unique to the memory device; and a storage system for storing the weak memory cell location information for the memory controller.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Figure 1:
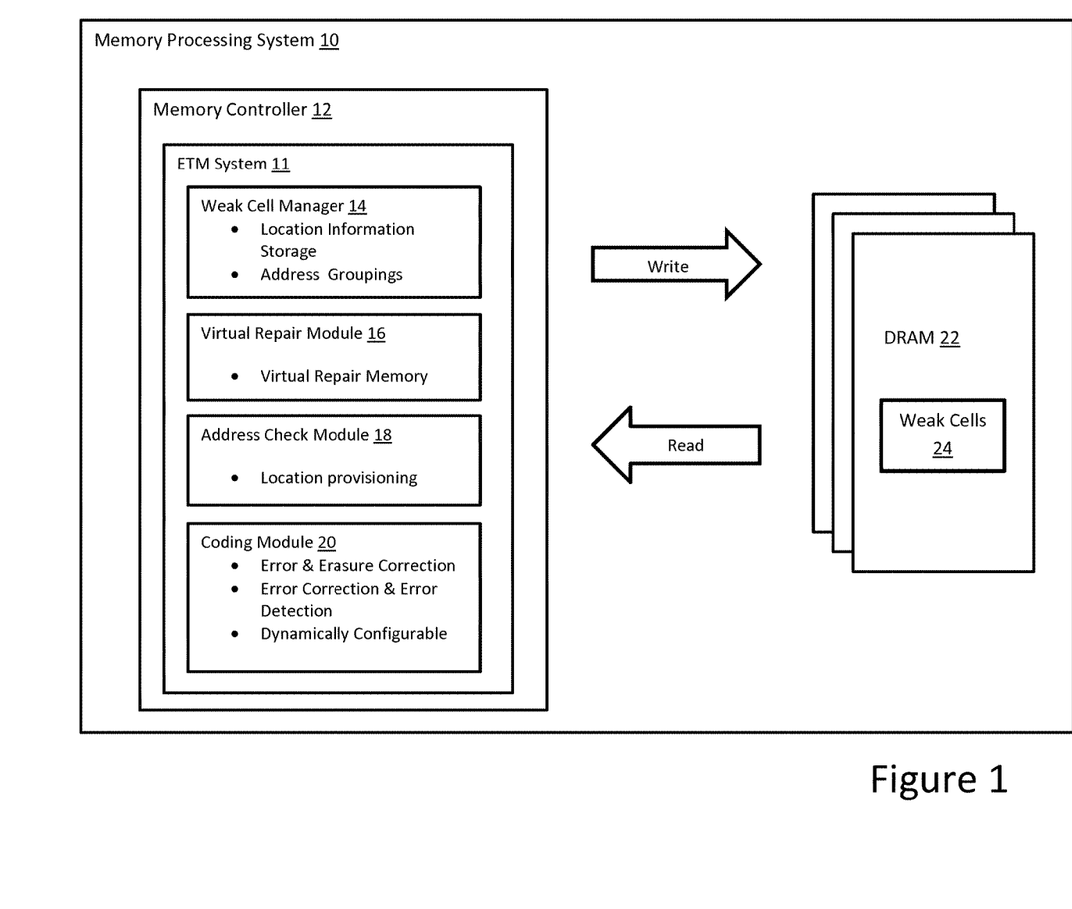
FIG. 1 depicts a data processing system having a memory controller with an error tolerant memory system according to embodiments.

Referring to the drawings, FIG. 1 depicts a memory processing system 10 having a memory controller 12 that includes an error tolerant memory (ETM) system 11 for accessing (i.e., writing date to and reading data from) one or more DRAMs 22, which are known or determined to have weak memory cells 24. For the purposes of this disclosure, the term "weak memory cell" refers to a memory cell that is identified as having some type of reliability issue which may cause it to fail under some or all operating conditions, and which are also referred to herein as "weak cells." Further, although described as being implemented for use with DRAMS 22, ETM system 11 can be implemented with any memory device having weak cells.

Rather than being implemented within the DRAM 22 itself, ETM system 11 is implemented as part of or along with a host device generally referred to as a memory controller 12, which may be implemented as any hardware device capable of reading and writing data to a memory device. This architecture allows for existing memory chip interfaces (e.g., DDRx) to be utilized without modification or only minor modification. As described herein, when data is written to, or read from, a DRAM 22, ETM system 11 implements a strategy or logic for handling, i.e., mitigating, weak memory cells 24. The strategy is done at the hardware or system-level using known technologies, e.g., integrated circuits, transistors, logic gates, etc., to ensure high speed performance.

In general, ETM system 11 includes: (1) a weak cell manager 14 for determining and/or storing weak cell location information; and (2) three integrated processes for handling weak memory cells 24. The three processes, described in further detail herein, include a virtual repair module 16 for handling memory addresses known to have a very large number of weak cells 24; an address check module 18 for performing address (e.g., table, database, etc.) look-ups; and a coding module 20 for providing error correction coding and decoding operations.

The use of system-level memory error tolerance for mitigating memory errors is subject to two major issues: (i) Storage redundancy overhead: the DRAM 22 has to store certain redundancy to facilitate the error tolerance, which reduces the effective DRAM storage density and hence increases the effective bit cost; and (ii) Latency and energy consumption overhead: Memory error-tolerance operations will increase the DRAM access latency and consume energy, which can degrade the overall system speed performance and energy efficiency. As described, ETM system 11 provides the necessary logic to achieve very strong memory error-tolerance with minimal implementation overhead in terms of redundancy, latency, and energy consumption.

Weak Cell Manager

As noted, weak cell manager 14 is responsible for determining, managing and/or storing weak cell location information. Depending on the implementation, weak cell manager 14 may include an infrastructure for either determining weak cell location information, or simply accessing the information from a provided source.

Regardless of how the weak cell location information is obtained, the information is hierarchically grouped by weak cell manager 14 into tiers (i.e., sets of addresses) based on the number of weak cells at a particular address. An address may for example comprise a 64 or 128 byte word that may have one or more weak cells.

Figure 2:
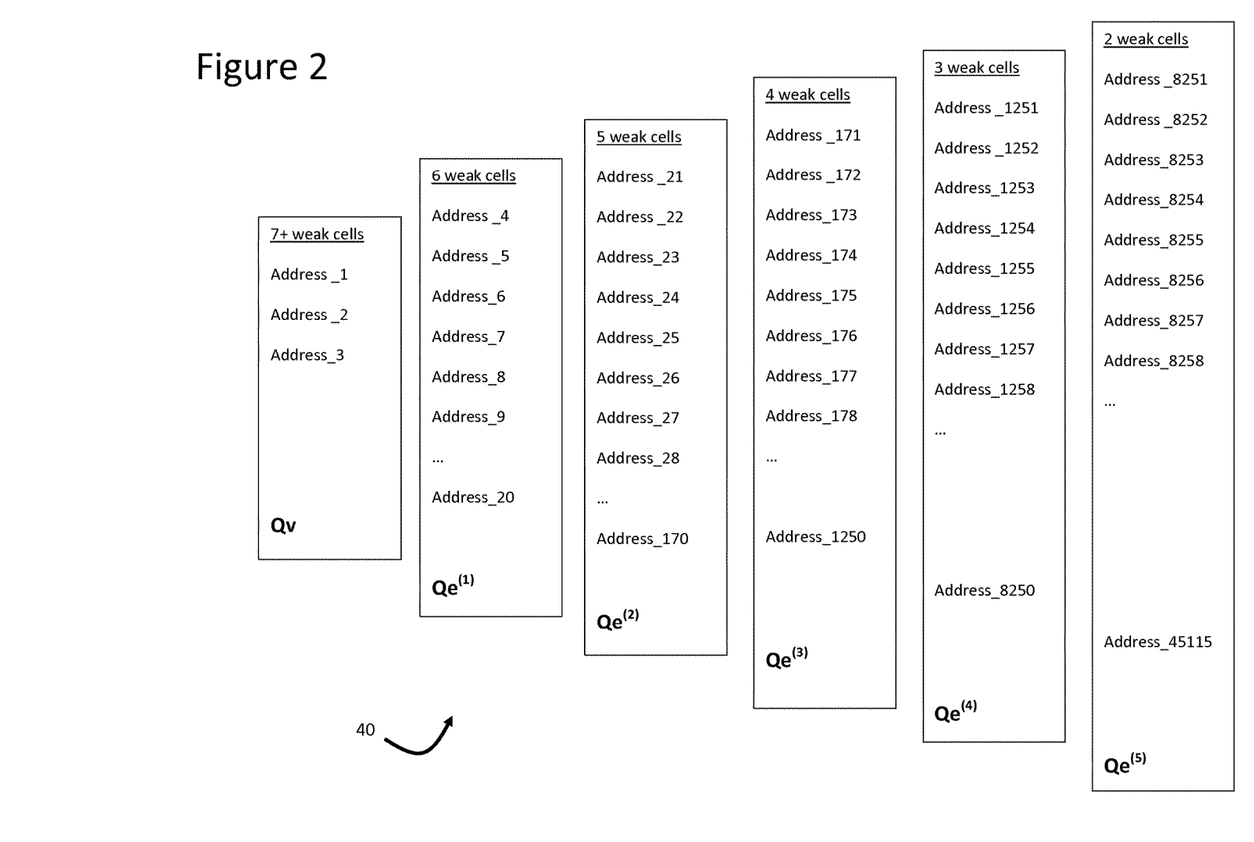
FIG. 2 depicts a hierarchical view of weak memory cell location information according to embodiments.

An example of this hierarchical data management is shown in FIG. 2. In this example, weak cell location information 40 is grouped into tiers of addresses with 7+ weak cells, 6 weak cells, 5 weak cells, etc. As is evident, the tier with 7+ weak cell is extremely small, i.e., three, while the subsequent tiers with 6 weak cells is 20, 5 weak cells is about 150, 4 weak cells is about 1080, 3 weak cells is 7000, and 2 weak cells is 37000. In addition, although not shown, weak cell manager 14 tracks the location of each weak cell within an address.

As described herein, the first tier of locations ($Q_v$) that have a number of weak cells greater than a predetermined threshold, e.g., 7+ weak cells, is handled separately by the virtual repair module 16. The remaining tiers of address information are organized in this manner by the weak cell manager 14 to provide efficiencies in processing addresses with known weak cells 24. In particular, each subsequent tier includes more and more addresses resulting in longer and longer look-up times. The strategy employed is to perform tiered look-ups when necessary, beginning with the tiers having the lowest number of addresses and progressing to subsequent tiers when required.

Accordingly, it is relatively quick for error tolerant memory system 11 to check to see if a target address falls into a group having a large number of weak cells, e.g., 5 or 6. Conversely, it becomes exponentially more time consuming to look up target addresses that have fewer, i.e., 4 or less, weak cells. This grouping strategy is exploited by the ETM system 11 logic described below to most efficiently utilize look-ups into the weak cell location information 40 provided by weak cell manager 14.

ETM System Logic

The following discussion provides the basis for the logic implemented by ETM system 11. As noted, ETM system 11 integrates three different processes for dealing with weak memory cells 24. The first such process is implemented by virtual repair module 16, which checks to see if a target address being accessed belongs to a small set of addresses known to have more weak cells than a predetermined threshold (e.g., 7+ weak cells). If so, ETM system 11 uses a local cache, referred to a virtual repair memory, to handle error correction. If not, ETM system 11 iteratively utilizes a combination of error correction code (ECC) processing and address look-ups to efficiently process an address with weak cells 24.

This approach is explained as follows. Let k denote the DRAM system access unit size (e.g., 64-bit or 128-bit). Each k-bit data is protected with a (n, k, d) ECC, where n is the codeword length and d is the codeword minimum distance. Let t denote the number of bit errors to be corrected, given the minimum distance of d, where $$d-1 \geq 2t. \tag{1}$$

In addition to the t-bit error correction, if up to c bit errors (where c>t) are to be detected, then $$d-1 \geq t+c. \tag{2}$$

If the location of a bit error is known a priori, it is called a bit erasure. Let e denote the number of erasures to be corrected, then $$d-1 \geq 2t+e. \tag{3}$$

Let $t_{soft}$ denote the number of random errors (e.g., radiation-induced soft errors) that must be tolerated within each n-bit word. Accordingly, the minimum distance d of the ECC must satisfy $d-1>2t_{soft}$. Define $e_{max}=d-1-2t_{soft}$, which is the maximum number of erasures that can be tolerated by the (n, k, d) code. Let $t_{max}=(d-1)/2$, and let $n_{weak}$ denote the number of weak (i.e., "bad") memory cells in each group of n memory cells that store one n-bit word. Let $r=d-1-t_{max}-t_{soft}$, the entire memory address space is then partitioned into 2+r sets Qv, $Qe^{(1)}, \ldots, Qe^{(r)}$, and Qc.

The set Qv consists of all the memory addresses for which $n_{weak}>e_{max}$ (e.g., 7+ in FIG. 2). From (2), it is known that the (n, k, d) ECC cannot guarantee the data storage integrity of the n-bit words at the memory addresses in the set Qv.

Among the r sets, $Qe^{(1)}, \ldots, Qe^{(r)}$, each set $Qe^{(i)}$ consists of all the memory addresses for which $n_{weak}=e_{max}+1-i$ for $1 \leq i \leq r$. From (3), it is known that the (n, k, d) ECC can guarantee the data storage integrity of the n-bit words at the memory addresses in the set $Qe^{(i)}$ only when the weak cells are explicitly treated as erasures (i.e., the locations of the weak cells are known to the ECC decoder).

The set Qc consists of all the memory addresses for which $n_{weak} \leq t_{max}-t_{soft}$. From (1), it is known that the (n, k, d) ECC can guarantee the data storage integrity of the n-bit words at the memory addresses in the set Qc even without knowing the locations of the weak cells.

Figure 3:
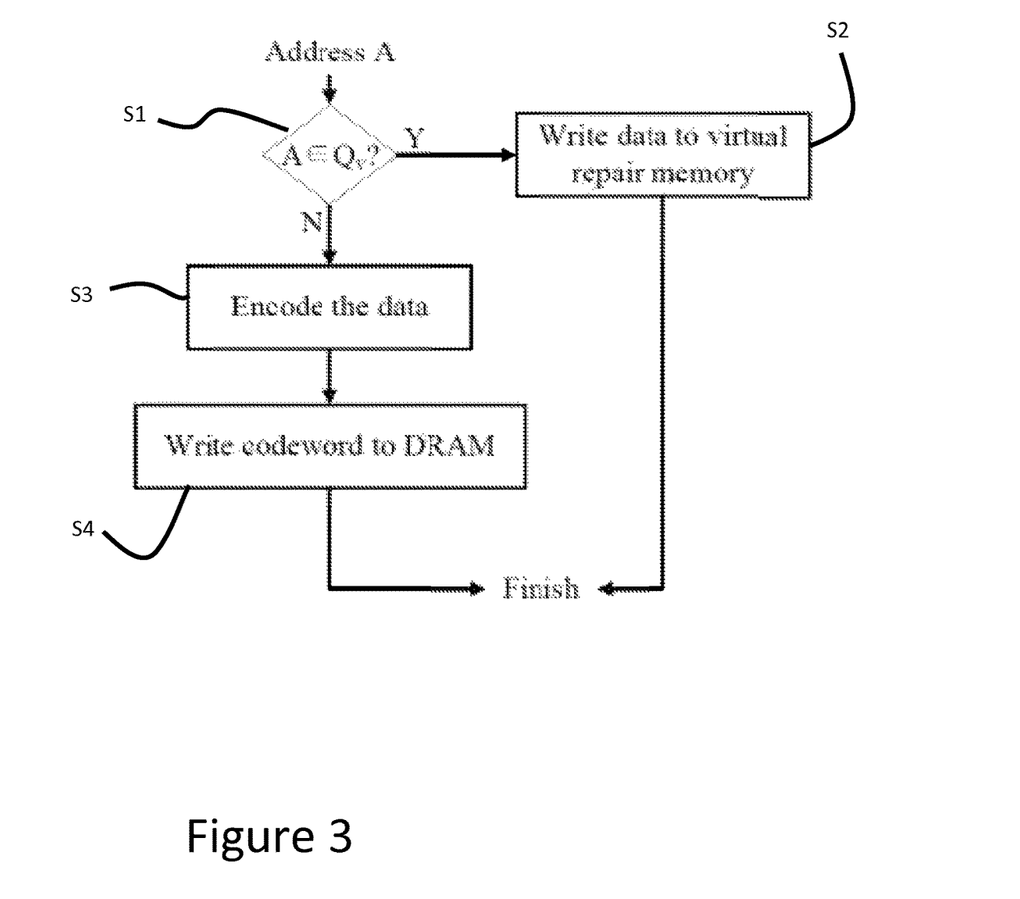
FIG. 3 depicts a flow diagram showing a write operation according to embodiments.

FIG. 3 shows the logic flow employed by ETM system 11 for writing data. When the memory controller 12 writes a k-bit word to the DRAM 22 at the target address of A, the memory controller 12 first checks at S1 whether A is in the set Qv, i.e., whether the address A contain a number of weak cells greater than a defined threshold. If A∈Qv, then the k-bit data is stored at S2 into a small memory, referred to as virtual repair memory, embedded in the memory controller 12 instead of writing to the DRAM 22. If A is not in the set Qv, the memory controller 12 encodes the k-bit data at S3 to generate a n-bit word and stores it to the DRAM 22 at the address of A at S4.

Figure 4:
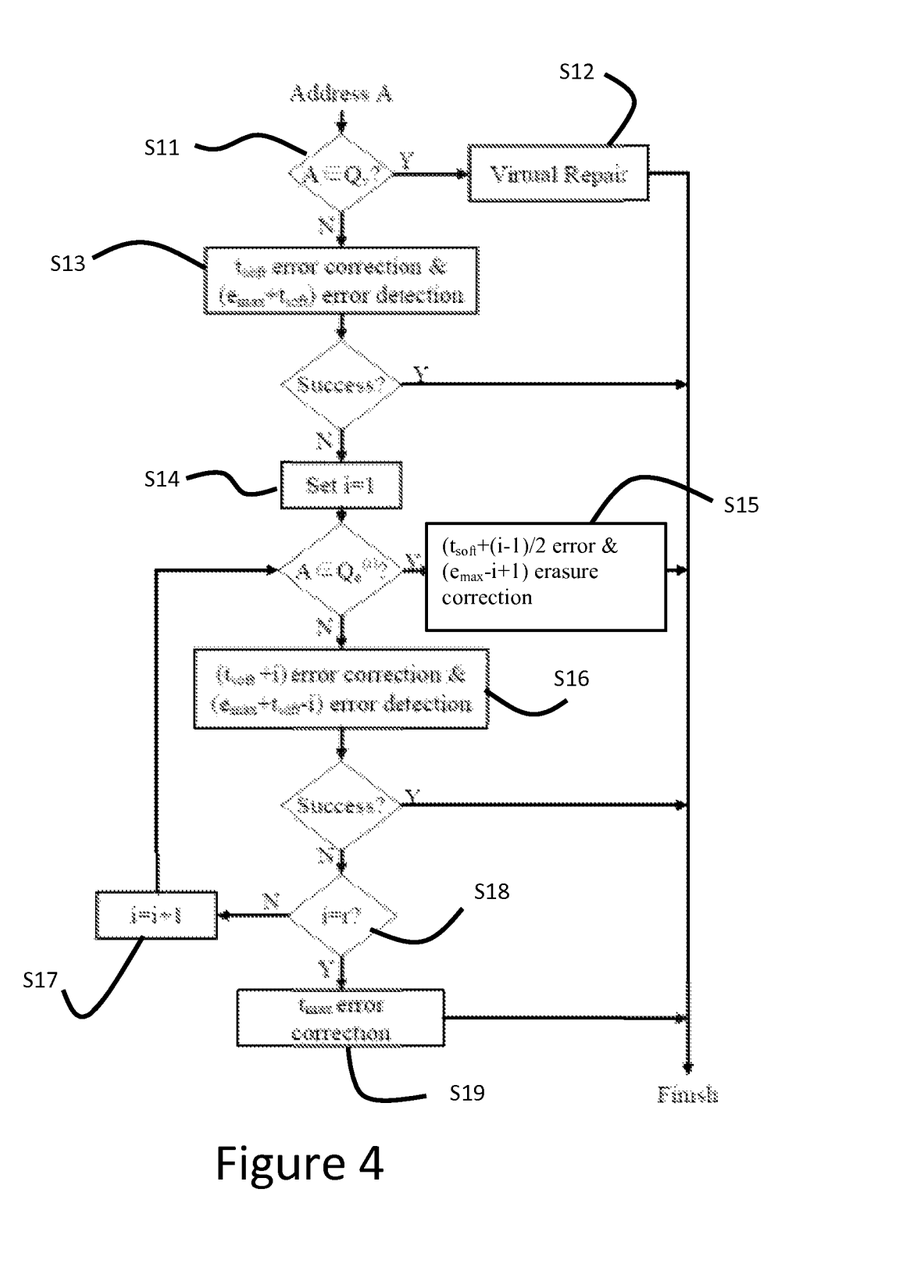
FIG. 4 depicts a flow diagram showing a read operation according to embodiments.

FIG. 4 shows the logic flow employed by ETM system 11 for reading data. When the system needs to read the k-bit data from the DRAM 22 at the target address of A, the memory controller 12 first checks at S11 whether A is in the set Qv. If A∈Qv, the k-bit data is directly read from the virtual repair memory embedded in the memory controller 12 at S12. If A is not in the set Qv, then the n-bit word is read from the DRAM 22 at the address of A, and error correction and error detection decoding is carried out at S13 which can correct up to $t_{soft}$ errors (e.g., 1 error using the example in FIG. 2) and consequently detect up to $e_{max}+t_{soft}$ errors (e.g., 6 errors using the example shown in FIG. 2). This process is carried out independently of any weak cell location information.

If errors are detected (i.e., the output of the $t_{soft}$ error-correcting decoding is not a valid codeword), the memory controller sets i=1 and checks whether A is in the set $Qe^{(1)}$ at S14. If A∈$Qe^{(1)}$, the DRAM weak cell location information associated with the address of A is fetched, and ETM system 11 carries out the error and erasure decoding at S15 that can correct up to $t_{soft}$ errors and up to $e_{max}$ erasures, which guarantees to generate a valid codeword and recover the original k-bit data. If A is not in set $Qe^{(1)}$, then error correction and detection decoding is carried out at S16 that can correct up to $t_{soft}+1$ errors and consequently detect up to $e_{max}+t_{soft}-1$ errors. If corrections cannot be made (i.e., the output of the ($t_{soft}+1$)-error-correcting decoding is not a valid codeword), i is incremented at S17 and the memory controller 12 checks whether A is in the set $Qe^{(2)}$. If A∈$Qe^{(2)}$, the DRAM weak cell location information associated with the address of A is fetched, and decoding that can correct up to $t_{soft}$ errors and up to $e_{max}-1$ erasures is carried out, which guarantees to generate a valid codeword and recover the original k-bit data. If A is not in the set $Qe^{(2)}$, then decoding is carried out which can correct up to $t_{soft}+2$ errors and consequently detect up to $e_{max}+t_{soft}-2$ errors. The process continues until a successful decoding occurs or all the r sets $Qe^{(i)}$'s have been checked (i=r) at S18. Finally, decoding that can correct up to $t_{max}$ errors is carried out at S19.

It is clear that $|Qv| \ll |Qe^{(1)}| \ll \ldots \ll |Qe^{(r)}| \ll |Qc|$. Hence, if p(Q) and f(Q) denote the likelihood and computational complexity required for checking whether an address A is in a set Q during memory read, then $p(Qv)=1 \gg p(Qe^{(1)}) \gg \ldots \gg p(Qe^{(r)})$ and $f(Qv) \ll f(Qe^{(1)}) \ll \ldots \ll f(Qe^{(1)})$.

Illustrative Embodiments

Referring again to FIG. 1, an illustrative embodiment for implementing ETM system 11 is as follows.

Figure 5:
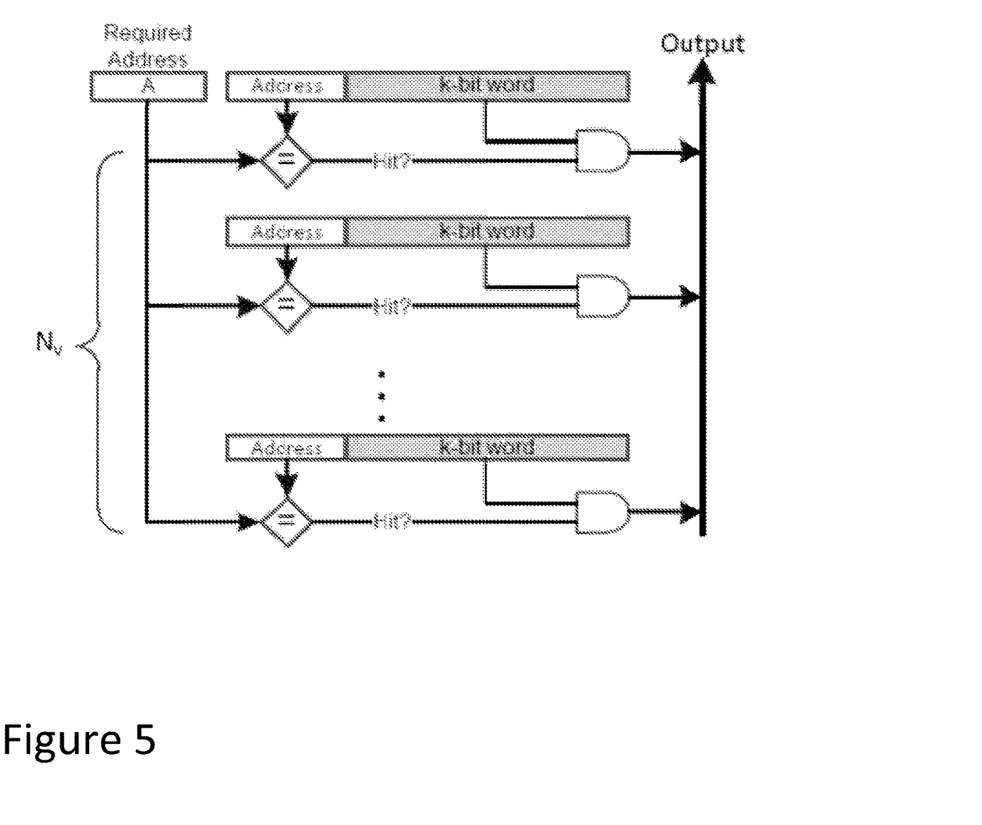
FIG. 5 depicts a virtual repair memory according to embodiments.

Virtual repair module 16 is responsible to virtually repair all the addresses in the set Qv. The virtual repair module 16 may function as a fully associative cache that holds all the addresses in the set Qv. Upon a memory access request, the first check is whether the address hit this fully associative cache, and in case of a cache hit the data is directly written/read to/from this fully associative cache. FIG. 5 shows one possible implementation of the virtual repair module 16.

In this example, let Nv denote the maximum possible number of entries in the set Qv (i.e., Nv=max(|Qv|). The virtual repair module 16 contains Nv address registers, each register stores one address in the set Qv. Associated with each address register, there is a k-bit register that stores the k-bit word that have been written the corresponding address.

For each memory access request, the address is compared with all the Nv address registers, and in case of a match (i.e., a cache hit) the corresponding k-bit register is directly used to serve the memory access request.

Address check module 18 is configured to check whether the address A is in the set $Qe^{(1)}, \ldots, Qe^{(r)}$, and if $A \in Qe^{(i)}$ it provides the locations of all the $t_{max}+1-i$ weak cells at the address A. As pointed out, in case the initial $t_{soft}$-error-correcting decoding fails to recover a valid codeword, the process successively checks whether $A \in Qe^{(i)}$ where i increases from 1 to r. It is highly desirable to finish the address check operations as quickly as possible and limit significant implementation overhead for the memory controller.

One possible implementation of the address check module 18 is described as below. First, for each set $Qe^{(i)}$, the entire memory address space is partitioned into $s_i$ equal-sized segments $A(i, j)$ ($1 \leq j \leq s_i$). Accordingly, set $Qe^{(i)}$ is partitioned into $s_i$ subsets $Qe^{(i,j)}$ ($1 \leq j \leq s_i$), and the subset $Qe^{(i,j)}$ contains all the addresses within the segment $A(i, j)$ that contains $e_{max}+1-i$ weak cells. All the subsets $Qe^{(i,j)}$'s and the associated weak cell locations are stored in an off-chip memory. The address check module contains r memory blocks $M_i$ for $1 \leq i \leq r$, and the memory block $M_i$ can store up to $l_i$ subsets (where $l_i \leq s_i$) among all the $s_i$ subsets $Qe^{(i,j)}$ ($1 \leq j \leq s_i$).

To check whether $A \in Qe^{(i)}$, the address check module first calculates the address segment index h for which $A \in A(i, h)$, and checks whether the subset $Q2^{(i, h)}$ resides in the embedded memory block if not then it reads $Q2^{(i, h)}$ and the associated weak cell location information from the off-chip memory and stores in its own memory block, which may replace another subset that already resides in the memory block $M_i$. Once the subset $Q2^{(i, h)}$ resides in the memory block $M_i$, its sorted entries are searched to check whether current address $A \in Q2^{(i, h)}$ and output the corresponding weak cell locations. The search can be done using various binary search algorithms.

Coding module 20 of FIG. 1 carries out the data encoding and error/erasure decoding and detection operations using the (n, k, d) code. Upon a memory write request with the address A, in case of a cache miss in the virtual repair module (i.e., A is not in Qv), the coding module 20 encodes the k-bit data into a n-bit word, which is written to the memory at the address of A.

Upon a memory read request with the address A, in case of a cache miss in the virtual repair module (i.e., A is not in Qv), the memory controller 12 fetches the n-bit word from the memory at address A and feeds it to the coding module 20. The coding module 20 decodes the n-bit word to recover the original k-bit data, and the detailed operations are described as follows.

Regardless of the specific codes being used (e.g., Hamming, BCH, or RS codes), an error correction process typically involves two operations: (1) syndrome calculation that calculates all the syndromes based upon the input data, and (2) decoding that utilizes the syndromes and erasure locations to determine the locations of all the bit errors and values of all the bit errors and erasures. The coding module 20 contains three processing blocks: (i) an a encoding block that carries out the encoding, (ii) syndrome block that calculates and updates the syndromes, and (iii) a configurable decoding block that can carry out decoding with dynamically configurable parameters including the number (denoted as t) of correctable bit errors, the number (denoted as e) of weak cells (i.e., erasures) and their locations (denoted as ve). Given the input n-bit word, the syndrome block calculates all the d−1 syndromes. If all the d−1 syndromes are zeros, then the n-bit word is a valid codeword (i.e., it does not contain any errors) and the k-bit data is directly output without further decoding. Otherwise, the configurable decoding block carries out the decoding with the procedure as described below:

1) First, carry out the decoding by setting $t=t_{soft}$ and $e=0$ (i.e., decoding without any erasure information), and update the d−1 syndromes based upon the decoding output;

2) If all the d−1 syndromes are zeros, the decoding succeeds. Otherwise, check whether the memory address is in the set $Qe^{(1)}$, which is done by the address check module.

3) If the address is in the set $Qe^{(1)}$, the address check module will provide the locations of all the $e_{max}$ weak cells, and accordingly we carry out the decoding by setting $t=t_{soft}$ and $e=e_{max}$ and providing the locations of all the $e_{max}$ weak cells. Such decoding guarantees to recover the valid codeword and generate the correct output.

4) If the address is not in the set $Qe^{(1)}$, carry out the decoding by setting $t=t_{soft}+1$ and $e=0$. After the decoding, update all the d−1 syndromes based on the decoding output, if all the d−1 syndromes are zeros, the decoding succeeds. Otherwise, continue on to check the set $Qe^{(2)}$, and the process repeats until a successful decoding or all the r sets have been checked.

5) Finally, carry out $t_{max}$-error-correcting decoding, which guarantees to recover the valid codeword and generate the correct output.

Weak Cell Location Information

As noted, weak cell location information may be obtained or provided in any manner and it is understood that a "weak cell" refers to a memory cell that cannot guarantee data storage integrity under a given working environment (e.g., the temperature and refreshing period for the case of DRAM). Therefore, for the same memory chip, different working environments may correspond to different sets of weak cells. DRAM manufacturers typically carry out thorough testing on each DRAM chip under a stringent environment (e.g., above 85 degrees C. and refreshing period of 256 ms), and accordingly perform redundancy-repair to repair all the weak cells. In current practice, DRAM manufacturers only release those DRAM chips without a single weak cell (after on-chip redundancy-repair) to the market. The invented memory error-tolerance design solution described herein can most effectively tolerate a large number of weak cells, as long as the memory controller 12 knows the weak cell location information.

Regardless of how the weak cell location information is obtained, memory controller 12 would store the r+1 sets Qv, $Qe^{(1)}, \ldots, Qe^{(r)}$, permanently in a non-volatile data storage device such as solid-state and magnetic recording drives. In addition, for each address in the r sets $Qe^{(1)}, \ldots, Q^{(r)}$, it stores the locations of all the weak cells.

Four different strategies for providing weak cell location information are provided as follows.

In a first approach, weak cell location information for a DRAM can be stored within the DRAM chip itself. With known embedded non-volatile memory technology, DRAM manufacturers can fabricate a certain amount of embedded non-volatile memory on each DRAM die/chip for storing the weak memory cell information. Since the weak cell information only needs to be written onto the embedded non-volatile memory once, very low-cost one-time programmable embedded non-volatile memory technology may be used. In addition, lossless data compression can be applied to compress the weak cell location information to reduce its storage footprint. As a result, the memory controller 12 can directly read the weak cell location information from DRAM chips. The advantages of this strategy are that accurate weak cell location information can be provided in a manner that results in minimal processing by the memory controller 12. In this approach, the DRAM I/O interface must be enhanced to support the read of weak cell location information from DRAM chips.

In a second approach, weak cell location information may be recorded inside each associated memory module. For the scenarios where DRAM are sold in the form of modules such as DIMM (dual in-line memory module) and HMC (hybrid memory cube), a logic chip/die on the module (e.g., buffer chip in DIMM, and control chip in HMC) could be included. DRAM manufacturers or module manufacturers can carry out thorough memory testing and record the weak cell location information on the logic chip/die instead of the DRAM chip/die. As a result, the memory controller 12 can directly read the weak cell location information from the logic die/chip inside the module. The advantages include the providing of accurate weak cell location information with minimal efforts on the memory controller side, and no impact on DRAM fabrication. The memory module I/O interface must be enhanced to support the read of weak cell location information In a third approach, in-field or on-site memory testing may be performed before the DRAM is placed into service. In this case, the memory controller 12 can carry out in-field memory testing to identify weak cells, and accordingly store the weak cell location information. This approach would provide an infrastructure to carry out exhaustive testing to detect all the weak memory cells at each memory address (i.e., each n cells group storing one n-bit word). The advantages include no impact on DRAM fabrication and no impact on DRAM I/O interface.

In a fourth approach, a remote access process, e.g., on-line, cloud-based, internet based, etc. system may be utilized to obtain weak cell location information from a remote storage. Similar to the first and second strategy, DRAM manufacturers and/or module manufacturers must carry out thorough memory testing to capture all the weak cells. Instead of directly recording the weak cell location information in each individual DRAM die/chip or module, DRAM and/or module manufacturers can for instance build and maintain an on-line weak cell location information database.

Each DRAM or module is assigned a unique identifier such as a serial number. DRAM or module manufacturers only need to record the unique identifier into the DRAM chip or module. The memory controller 12 can use the unique identifier as the key to search the remote storage and obtain the weak cell location information. The advantages of this strategy include the fact that weak cell location information can be obtained with minimal efforts on the memory controller 12. Furthermore, there is no impact on DRAM fabrication, and only marginal impact on DRAM I/O interface. Further, in such an approach, it is easy to provide multiple sets of weak cell information corresponding to different working environments. In addition, the system only needs to download the weak cell location information once from the on-line database.

Figure 6:
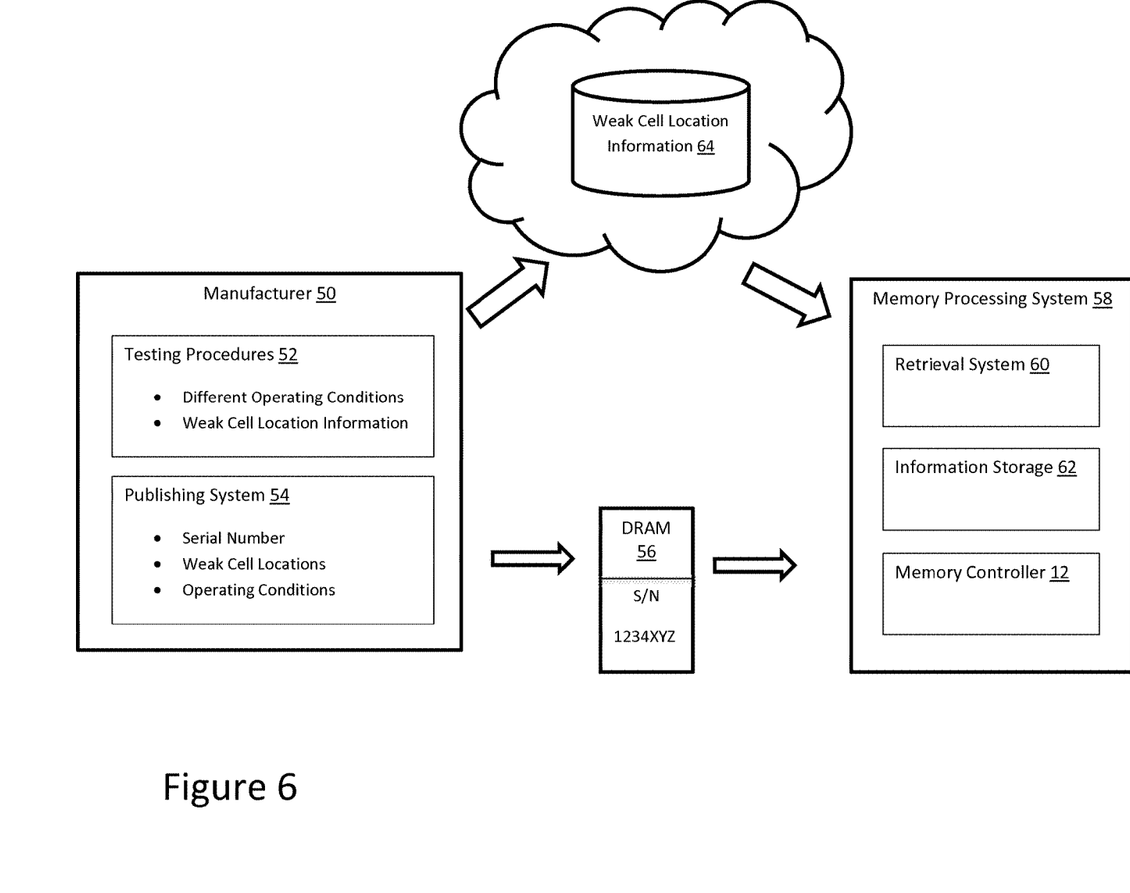
FIG. 6 depicts a weak cell memory location information retrieval system according to embodiments.

An example of the fourth approach is shown in FIG. 6. In this example, a manufacturer 50 implements testing procedures 52 to identify weak cell location information for a device such as DRAM 56, potentially under different operating conditions. Thus for example, the testing procedures 52 may provide different sets of results under different operating speeds, temperature ranges, etc. Publishing system 54 then publishing the weak cell location information 64 to a remote storage, e.g., to the Internet or a cloud based server. Accordingly, weak cell location information 64 may comprise a multidimensional database for each unique device identified with a serial number (S/N). For example, for device 56 having S/N 1234XYZ, a first set of weak cell location information may be provided for a first temperature range and a second set of weak cell location information may be provided for a second temperature range.

When the memory processing system 58 first installs/uses the DRAM 56, retrieval system 60 downloads the weak cell location information 64 for the DRAM 56, which is saved by information storage 62. Weak cell location information 64 may be retrieved for all operating conditions or just one specific to the current environment. Once saved, memory controller 12 utilizes the weak cell location information 64 in a manner such as that described herein.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual skilled in the art are included within the scope of the invention as defined by the accompanying claims.

The invention claimed is:

1. A system for handling memory access operations on a memory device, comprising:
a weak cell manager for storing location information of weak memory cells, wherein the location information includes addresses grouped into tiered sets based on a number of weak memory cells;
a virtual repair module that reads data from a virtual repair memory if a target address being read belongs to a first set of addresses having a number of weak memory cells exceeding a threshold;
an address check module that determines if the target address belongs to a selected set of addresses; and
a coding module that performs error and erasure correction when the address check module determines that the target address belongs to the selected set of addresses, and performs error correction and error detection when the address check module determines that the target address does not belong to the selected set of addresses.

2. The system of claim 1, wherein the coding module further performs error correction and error detection when the target address does not belong to the first set of addresses.

3. The system of claim 1, wherein the coding module is dynamically configurable to decode at different error detection, error correction and erasure correction settings.

4. The system of claim 1, wherein the memory device comprises a dynamic random access memory (DRAM).

5. The system of claim 1, wherein the address check module provides a location of each weak cell if the target address belongs to the selected set of target addresses.

6. The system of claim 1, wherein the virtual repair module writes data to the virtual repair memory during a write operation if the target address belongs to the first set of addresses.

7. The system of claim 6, wherein the virtual repair memory comprises a cache that includes a set of registers.

\* \* \* \* \*